(12) United States Patent
Huh (10) Patent No.: US 9,978,459 B2
(45) Date of Patent: May 22, 2018

(54) SEMICONDUCTOR DEVICE

(71) Applicant: SK hynix Inc., Gyeonggi-do (KR)

(72) Inventor: Jun Ki Huh, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 104 days.

(21) Appl. No.: 14/719,017

(22) Filed: May 21, 2015

(65) Prior Publication Data

US 2016/0172056 A1 Jun. 16, 2016

(30) Foreign Application Priority Data

Dec. 12, 2014 (KR) ........................ 10-2014-0179783

(51) Int. Cl.
| | |
|---|---|
| *G11C 8/12* | (2006.01) |
| *G11C 16/34* | (2006.01) |
| *G11C 29/42* | (2006.01) |
| *G11C 29/52* | (2006.01) |

(52) U.S. Cl.
CPC ........ *G11C 16/349* (2013.01); *G11C 16/3495* (2013.01); *G11C 29/42* (2013.01); *G11C 29/52* (2013.01)

(58) Field of Classification Search
CPC ..... G11C 11/5642; G11C 15/04; G11C 16/24; G11C 16/3495; G11C 29/00; G11C 29/52
See application file for complete search history.

(56) References Cited

U.S. PATENT DOCUMENTS

| | | | | |
|---|---|---|---|---|
| 5,668,774 A * | 9/1997 | Furutani | .............. | G11C 7/1033 365/193 |
| 5,844,849 A * | 12/1998 | Furutani | .............. | G11C 7/1033 365/194 |
| 7,430,693 B2 * | 9/2008 | Noguchi | ............. | G06F 11/1048 714/710 |
| 7,818,525 B1 * | 10/2010 | Frost | ................... | G06F 12/0246 365/185.25 |
| 8,027,194 B2 * | 9/2011 | Lee | ...................... | G11C 11/5628 365/185.03 |
| 8,565,021 B2 * | 10/2013 | Lee | ..................... | G11C 11/5628 365/185.03 |
| 8,614,919 B2 * | 12/2013 | Lee | ..................... | G11C 11/5628 365/185.18 |
| 8,625,344 B2 * | 1/2014 | Lee | ..................... | G11C 11/5628 365/185.03 |
| 8,638,585 B2 * | 1/2014 | Lee | ..................... | G11C 11/5628 365/185.03 |
| 8,705,272 B2 * | 4/2014 | Lee | ..................... | G11C 11/5628 365/185.03 |

(Continued)

FOREIGN PATENT DOCUMENTS

KR 1020100078198 7/2010

*Primary Examiner* — Phung M Chung
(74) *Attorney, Agent, or Firm* — IP & T Group LLP (57) ABSTRACT

A semiconductor device includes a memory array including a plurality of memory blocks, wherein the memory blocks are grouped into sub-block groups, and the sub-block groups are grouped into main block groups; an operation circuit suitable for performing a read operation and a test read operation on memory cells included in the memory block; and a read counter suitable for counting a first number of read operations for each word line in the respective main block groups and a second number of read operations for the respective sub-block groups.

18 Claims, 10 Drawing Sheets

(56) References Cited

U.S. PATENT DOCUMENTS

| | | | | |
|---|---|---|---|---|
| 8,760,918 B2* | 6/2014 | Lee | ..................... | G11C 11/5628 |
| | | | | 365/185.03 |
| 9,058,878 B2* | 6/2015 | Aritome | .............. | G11C 11/5642 |
| 2013/0117635 A1* | 5/2013 | Ok | ...................... | G06F 11/1048 |
| | | | | 714/773 |
| 2015/0006792 A1* | 1/2015 | Lee | ..................... | G06F 12/0246 |
| | | | | 711/103 |
| 2015/0213863 A1* | 7/2015 | Ha | ......................... | G11C 29/00 |
| | | | | 365/230.03 |

* cited by examiner

SEMICONDUCTOR DEVICE

CROSS-REFERENCE TO RELATED APPLICATION

The present application claims priority to Korean patent application number 10-2014-0179783, filed on Dec. 12, 2014, the entire disclosure of which is incorporated herein in its entirety by reference.

BACKGROUND

Field of Invention

Various embodiments of the present invention relate to a semiconductor device and, more specifically, to a semiconductor device including memory cells.

Discussion of Related Art

The threshold voltage of flash memory cells varies depending on the data it stores. To read the data stored in the memory cell, a read voltage is applied to a corresponding word line. To increase integration density, gaps between the memory cells, that is, gaps between the word lines, are made narrower. Because of this, when an operating voltage is applied to a selected word line for the selected memory cell), the threshold voltage of adjacent memory cells may vary. Therefore, reliability of data may be degraded and, therefore, a technique for overcoming this concern is required.

SUMMARY

Various embodiments of the present invention are directed to a semiconductor device capable of improving data preservation characteristics, and an operating method thereof.

One aspect of the present invention provides a semiconductor device including: a memory array which includes a plurality of memory blocks, wherein the memory blocks are grouped into sub-block groups, and the sub-block groups are grouped into main block groups; an operation circuit suitable for performing a read operation and a test read operation on memory cells included in the memory block; and a read counter suitable for counting a first number of read operations for each word line in the respective main block groups and a second number of read operations for the respective sub-block groups.

Another aspect of the present invention provides semiconductor device including: a memory array which includes a plurality of memory blocks, wherein the memory blocks are grouped into sub-block groups, and the sub-block groups are grouped into main block groups; and an operation circuit suitable for performing a read operation and a test read operation on memory cells included in the memory block, and counting a first number of read operations for each word line in the respective main block groups and a second number of read operations for the respective sub-block groups, wherein the operation circuit performs the test read operation on a sub-block group for which the first number of read operations or the second number of read operations is greater than a main reference number.

BRIEF DESCRIPTION OF THE DR WINGS

The above and other features and advantages of the present invention will become more apparent to those of ordinary skill in the art by describing in detail exemplary embodiments thereof with reference to the attached drawings in which.

DETAILED DESCRIPTION

Hereinafter, exemplary embodiments of the present invention will be described more fully with reference to the accompanying drawings to clarify aspects, features, and advantages of the present invention. The invention may, however, be embodied in many different forms and should not be construed as limited to the embodiments set forth herein. Rather, these embodiments are provided so that this disclosure will be through and complete, and will fully convey the concept of the invention to those of ordinary skill in the art. The present invention is defined by the appended claims.

Throughout the disclosure like reference numerals refer to like parts in the various figures and embodiments of the present invention. The drawings are not necessarily to scale and, in some instances, proportions may have been exaggerated in order to clearly illustrate features of the embodiments. It is also noted that in this specification, "connected/coupled" refers to one component not only directly coupling another component, but also indirectly coupling another component through an intermediate component. In addition, a singular form may include a plural form as long as it is not specifically mentioned.

Figure 1:
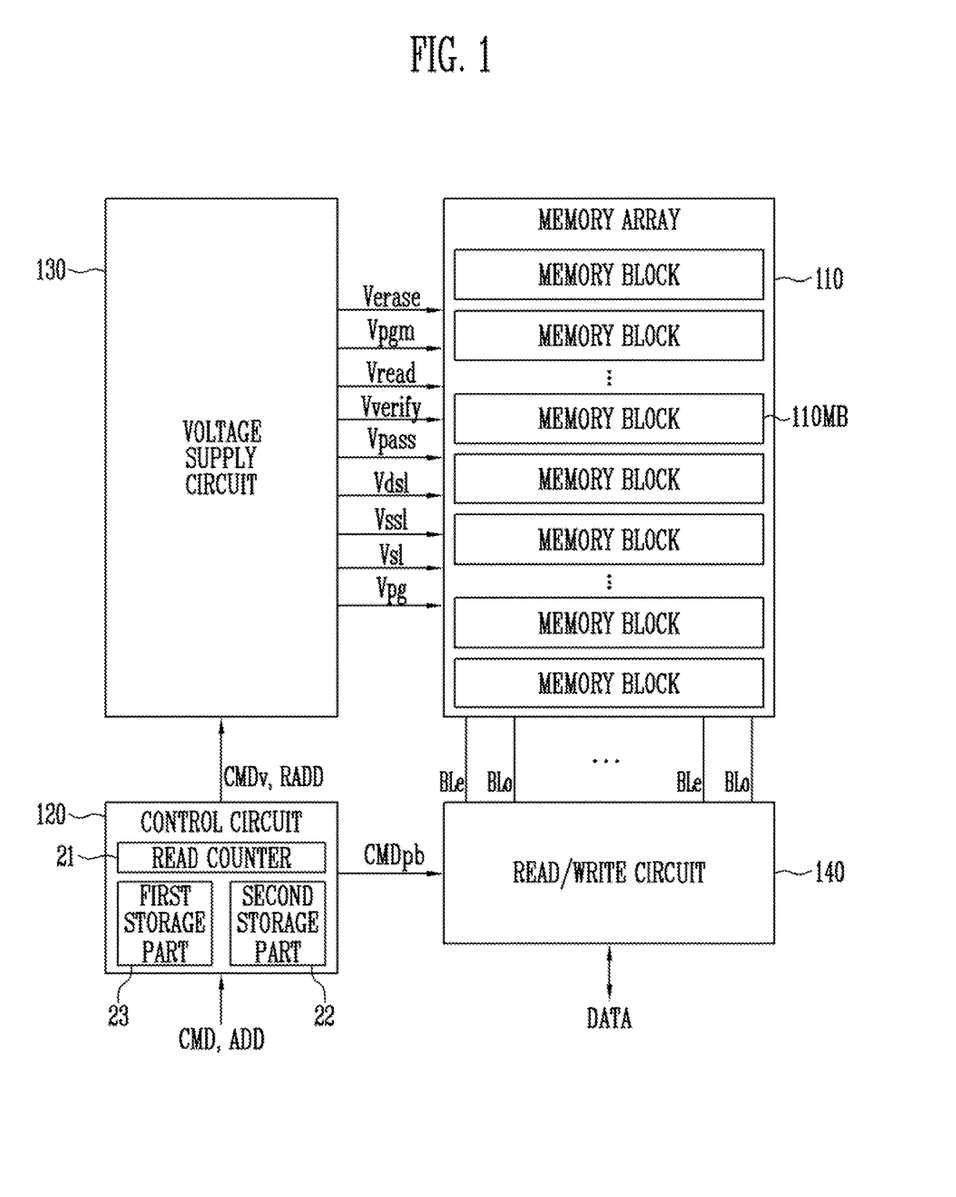
FIG. 1 is a block diagram illustrating a semiconductor device according to an embodiment of the present invention.

FIG. 1 is a block diagram illustrating a semiconductor device according to an embodiment of the present invention.

Referring to FIG. 1, the semiconductor device may include a memory array 110 and operation circuits 120 to 140. The memory array 110 includes a plurality of memory blocks 110MBs. Some memory blocks among the memory blocks 110MBs may be used as content addressable memory (CAM) blocks. The CAM blocks may be used for storing information such as operating conditions, the number of times that operations have been performed, and/or the like. When power is supplied, the information stored in the CAM blocks may be provided to the operation circuits 120 to 140 by a CAM read operation.

Each of the memory blocks includes a plurality of memory strings. Each of the memory strings includes a plurality of memory cells. In a flash memory device, a memory block may include flash memory cells. For example, the flash memory cells may include a floating gate formed of polysilicon or a charge trap layer formed of a nitride layer.

In particular, the memory block may include memory strings connected to bit lines, respectively, and be connected to a common source line in parallel. The memory strings may be formed in a 2-dimensional structure or a 3-dimensional structure on a semiconductor substrate. A memory block having a memory string of a 3-dimensional structure will be explained in detail.

Figure 2:
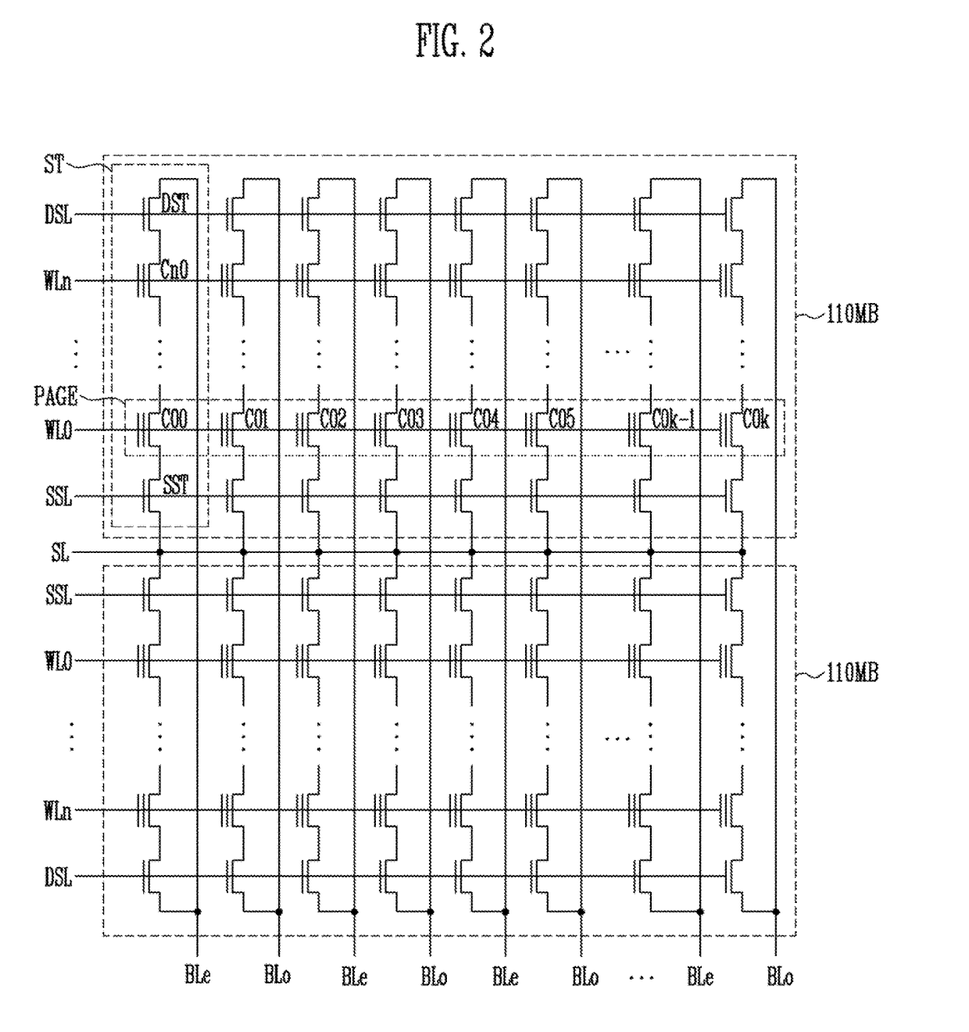
FIG. 2 is a detailed diagram of a memory block shown in FIG. 1.

FIG. 2 is a detailed diagram of the memory block 110MB shown in FIG. 1.

Referring to FIG. 2, each of the memory blocks 110MBs includes the memory strings STs connected between the bit lines BLe and BLo, and the common source line SL. That is, the memory strings STs are connected to the corresponding bit lines BLe and BLo, respectively, and commonly connected to the common source line SL. Each of the memory strings STs includes a source selection transistor SST of which a source is connected to the common source line SL, a cell string in which a plurality of memory cells C00 to Cn0 are connected in series, and a drain selection transistor DST of which a drain is connected to the bit line (e.g., BLe). The memory cells C00 to Cn0 included in the cell string are connected in series between the selection transistors SST and DST. A gate of the source selection transistor SST is connected to a source selection line SSL, gates of the memory cells C00 to Cn0 are connected to word lines WL0 to WLn, respectively, and a gate of the drain selection transistor DST is connected to a drain selection line DSL.

The drain selection transistor DST controls the connection between the cell string and the bit lines, and the source selection transistor SST controls the connection between the cell string and the common source line SL.

In a NAND flash memory device, memory cells included in a memory cell block may be classified based on a physical page or a logical page. Memory cells C00 to C0$k$ connected to one word line, for example, WL0, may form one physical page PAGE. Even memory cells C00, C02, and C04 to C0$k$−1 connected to one word line, for example, WL0, may form an even page, and odd memory cells C01, C03, and C05 to C0$k$ connected to the one word line may form an odd page. These pages (or, the even page and the odd page) may be the basic units for program operations and read operations.

Figure 3A:
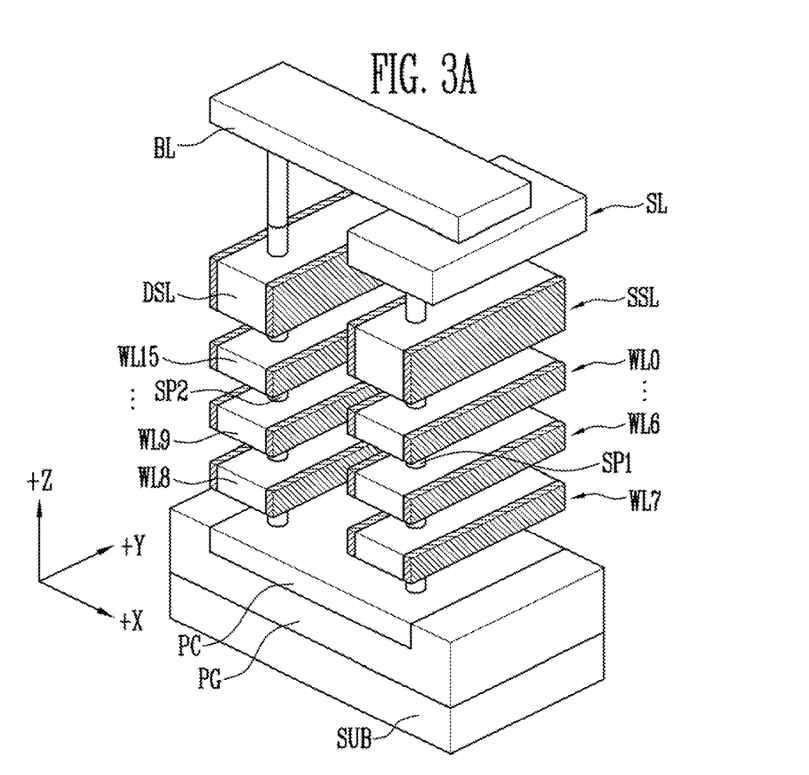
FIGS. 3A to 3C are views for describing a memory string shown in FIG. 1.
Figure 3B:
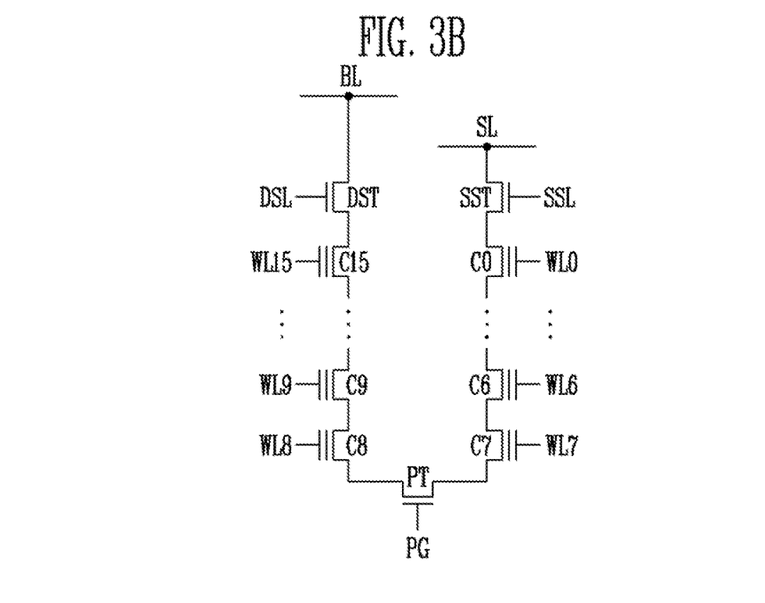
Figure 3C:
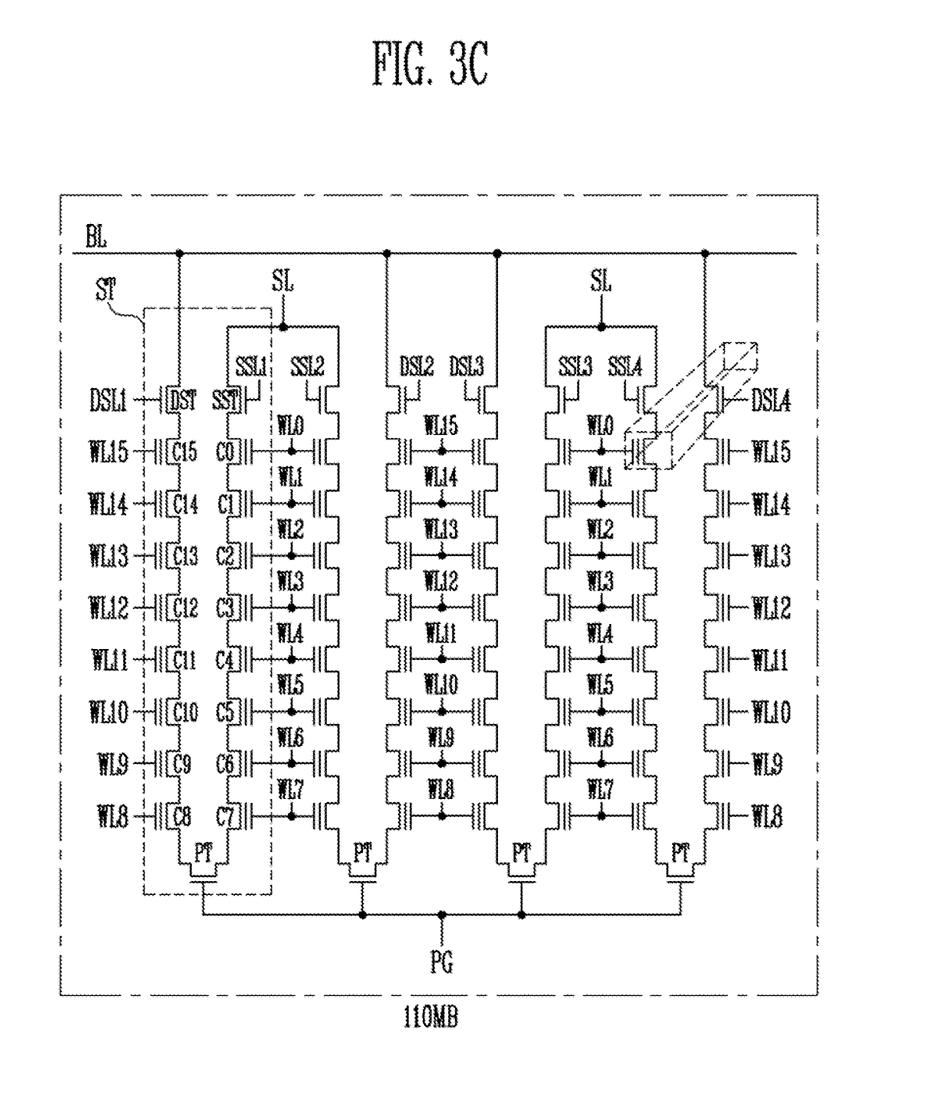

FIGS. 3A to 3C are views for describing the memory string shown in FIG. 1. FIG. 3A shows a perspective view of a memory string ST included in the memory block 110B shown in FIG. 1, FIG. 3B shows a circuit configuration of the memory string ST shown in FIG. 3A, and FIG. 3C shows a circuit configuration of the memory block 110B shown in FIG. 1.

Referring to FIGS. 3A and 3B, a pipe gate PG, which includes a recessed part, is formed on the semiconductor substrate SUB, and a pipe channel layer PC is formed in the recessed part of the pipe gate PG. A plurality of vertical channel layers SP1 and SP2 are formed on the pipe channel layer PC. An upper portion of the first vertical channel layer SP1 among the pair of the vertical channel layers SP1 and SP2 is connected to a common source line SL, and an upper portion of the second vertical channel layer SP2 is connected to a bit line BL. The vertical channel layers SP1 and SP2 may be formed of polysilicon.

A plurality of conductive layers DSL and WL15 to WL8 are formed to surround the second vertical channel layer SP2 at different heights of the second vertical channel layer SP2. Also, a plurality of conductive layers SSL and WL0 to WL7 are formed to surround the first vertical channel layer SP1 at different heights of the first vertical channel layer SP1. A multi-layered layer (not shown) including a charge trap layer is formed on a surface of the vertical channel layers SP1 and SP2 and a surface of the pipe channel layer PC, and a multi-layered layer is also interposed between the vertical channel layers SP1 and SP2 and the conductive layers DSL, WL15 to WL8, SSL, and WL0 to WL7 and between the pipe channel layer PC and the pipe gate PG.

The uppermost conductive layer which surrounds the second vertical channel layer SP2 may serve as a drain selection line DSL, and the conductive layers under the drain selection line DSL may serve as word lines WL15 to WL8. The uppermost conductive layer which surrounds the first vertical channel layer SP1 may serve as a source selection line SSL, and the conductive layers under the source selection line SSL may serve as word lines WL0 to WL7. Some of the conductive layers used as the word lines may serve as dummy word lines (not shown).

In other words, the first conductive layers SSL and WL0 to WL7 and the second conductive layers DSL and WL15 to WL8 are each stacked on different areas of the semiconductor substrate. The first vertical channel layer SP1, which passes through the first conductive layers SSL and WL0 to WL7, is connected in a direction substantially perpendicular to the substrate SUB between the common source line SL and the pipe channel layer PC. The second vertical channel layer SP2, which passes through the second conductive layers DSL and WL15 to WL8, is connected in a direction substantially perpendicular to the substrate SUB between the bit line BL and the pipe channel layer PC.

A drain selection transistor DST is formed at a portion in which the drain selection line DSL surrounds the second vertical channel layer SP2, and main cell transistors C15 to C8 are each formed at portions in which the word lines WL15 to WL8 surround the second vertical channel layer SP2. A source selection transistor SST is formed at a portion in which the source selection line SSL surrounds the first vertical channel layer SP1, and main cell transistors C0 to C7 are each formed at portions in which the word lines WL0 to WL7 surround the first vertical channel layer SP1.

According to the above-mentioned structure, the memory string ST may include the drain selection transistor DST and the main cell transistors C15 to C8, which are connected in a direction substantially perpendicular to the substrate SUB between the bit line BL and the pipe channel layer PC, and the source selection transistor SST and the main cell transistors C0 to C7, which are connected in a direction substantially perpendicular to the substrate SUB between the common source line SL and the pipe channel layer PC. In the above-mentioned structure, a dummy cell transistor (not shown) may be further connected between the selection transistor DST (or SST) and the main cell transistor C15 or C0, and a dummy cell transistor (not shown) may be further connected between the main cell transistor C8 or C7 and a pipe transistor PT.

The source selection transistor SST and the main cell transistors C0 to C7, which are connected between the common source line SL and the pipe transistor PT, may form the first vertical memory string, and the drain selection transistor DST and the main cell transistors C15 to C8, which are connected between the bit line BL and the pipe transistor PT, may form the second vertical memory string.

Referring to FIG. 3C, the memory block 110MB includes a plurality of memory strings STs connected to bit lines. The memory string ST in a U-shaped structure includes a first vertical memory string SST and C0 to C7 vertically connected between the common source line SL and the pipe transistor PT of a substrate, and a second vertical memory string C8 to C15 and DST vertically connected between the bit line BL and the pipe transistor PT of the substrate. The first vertical memory string SST and C0 to C7 includes a source selection transistor SST and memory cells C0 to C7. The source selection transistor SST is controlled by voltages applied to the source selection lines SSL0 and SSL1, and the memory cells C0 to C7 are controlled by voltages applied to the word lines to WL7 which are stacked. The second vertical memory string CS to C15 and DST includes a drain selection transistor DST and memory cells C8 to C15. The drain selection transistor DST is controlled by a voltage applied to the drain selection lines DSL1 to DSL4, and the memory cells CS to C15 are controlled by voltages applied to the word lines WL8 to WL15 which are stacked.

When the memory block 110MB is selected, the pipe transistor PT, which is connected between a pair of memory cells C7 and C8 disposed at a center of a memory string in the U-shaped structure, performs an operation that electrically connects the channel layers of the first vertical memory string SST and C0 to C7 included in the selected memory block 110MB to the channel layers of the second vertical memory string C8 to C15 and DST.

In a 2-dimensional structured memory block, one memory string is connected to every bit line and the drain selection transistors DSTs of the memory block are simultaneously controlled by one drain selection line. However, in the memory block 110MB with the 3 dimensional structure, a plurality of the memory strings STs are commonly connected to each bit line BL. In the same memory block 110MB, the number of the memory strings STs, which are commonly connected to one bit line BL and controlled by the same word lines may be changed depending on the purpose of the design, that is, to suit the particular objectives of the designer.

Since the memory strings are connected to one bit line BL in parallel, the drain selection transistors DSTs are independently controlled by select voltages applied to the drain selection lines DSL1 to DSL4 to selectively connect one bit line BL to the memory strings STs.

The memory cells C0 to C7 of the first vertical memory string SST and C0 to C7, and the memory cells C8 to C15 of the second vertical memory string C8 to C15 and DST, which are vertically connected in the memory block 110MB, are each controlled by operating voltages applied to the stacked word lines WL0 to WL7 and the stacked word lines WL8 to WL15. The above word lines WL0 to WL15 are classified based on a memory block.

The selection lines DSL1 to DSL4, SSL0 and SSL1 and the word lines WL0 to WL15 serve as local lines of the memory block 110MB. In particular, the source selection lines SSL0 and SSL1 and the word lines WL0 to WL7 may serve as local lines of the first vertical memory string, and the drain selection lines DSL1 to DSL4 and the word lines WL8 to WL15 may serve as local lines of the second vertical memory string. Gates PG of the pipe transistors PT may be commonly connected in the memory block 110MB.

In the memory block 110MB, memory cells which are connected to different bit lines and share the drain selection line, for example, DSL4, may form one page PAGE. The memory block may serve as a fundamental unit of an erase loop, and the page PAGE may serve as a fundamental unit of a program operation and a read loop.

Referring again to FIGS. 1 and 3B, the operation circuits 120 to 140 may perform a program loop, an erase loop, and a read operation on memory cells, for example, C0, connected to the selected word line, for example, WL0. The program loop includes a program operation and a program-verification operation, and the erase loop includes an erase operation and an erase-verification operation. The operation circuits 120 to 140 may perform a program operation (or a post-program operation) configured to adjust an erase level, in which threshold voltages of the memory cells are distributed, after the erase loop.

To perform the program loop, the erase loop, and the read operation, the operation circuits 120 to 140 may selectively output the operating voltages to the local lines SSL, WL0 to WLn, PG, and DSL and the common source line SL of the selected memory block, and control precharging/discharging of the bit lines BLs or detect a current flow (or a voltage variation) of the bit lines BLs.

In a NAND flash memory device, the operation circuits include a control circuit 120, a voltage supply circuit 130, and a read/write circuit 140.

The control circuit 120 controls the voltage supply circuit 130 to generate operating voltages Verase, Vpgm, Vread, Vverify, Vpass, Vdsl, Vssl, Vsl, and Vpg for performing the program loop, the erase loop, and the read operation at target levels and to apply the operating voltages to the local lines SSL, WL0 to WLn, PG, and DSL of the selected memory block and the common source line SL, in response to a command signal CMD input from the outside. For these controls, the control circuit 120 may output a voltage control signal CMDv and a row address signal RADD to the voltage supply circuit 130. Also, the control circuit 120 controls the read/write circuit 140 to control precharging/discharging of the bit lines BLs based on data to be stored in the memory cells to perform the program loop, the erase loop, and the read operation, or detect a current flow (or a voltage variation) of the bit lines BLs during the read operation or the program-verification operation. For these controls, the control circuit 120 may output an operation control signal CMDpb to the read/write circuit 140.

The voltage supply circuit 130 generates the operating voltages Verase, Vpgm, Vread, Vverify, Vpass, Vdsl, Vssl, Vsl, and Vpg required in the program loop, the erase loop, and the read operation on the memory cells based on the voltage control signal CMDv of the control circuit 120. The operating voltages may include an erase voltage Verase, a program voltage Vpgm, a read voltage Vread, a pass voltage Vpass, select voltages Vdsl and Vssl, a common source voltage Vsl, a pipe gate voltage Vpg, and/or the like. Also, the voltage supply circuit 130 outputs the operating voltages to the local lines SSL, WL0 to WLn, PG, and DSL of the selected memory block and the common source line SL, in response to a row address signal RADD of the control circuit 120.

The read/write circuit 140 may include a plurality of page buffers (not shown) respectively connected to the memory array 110 through the bit lines BLs. In particular, the page buffers may be connected to the bit lines BLs, respectively. That is, each of the page buffers may be connected to a corresponding bit line. In the program operation, the page buffers selectively precharge the bit lines BLs based on the operation control signal CMDpb of the control circuit 120 and data to be stored in the memory cells. In the program-verification operation or the read operation, based on the operation control signal CMDpb of the control circuit 120, the read/write circuit 140 may precharge the bit lines BLs, and then detect the voltage variation or current of the bit lines BLs and latch data read from the memory cell.

The control circuit 120 may include a read counter 21, a first storage part 23 and a second storage part 22. The read counter 21 may count the number of times (i.e., a first number of read operations) that read operations have been performed. The first and second storage parts 23 and 22 may store the number of read operations. In particular, the read counter 21 may count the number of times (i.e., a second number of read operations) that read operations have been performed on each memory block group and for each word line.

Figure 4:
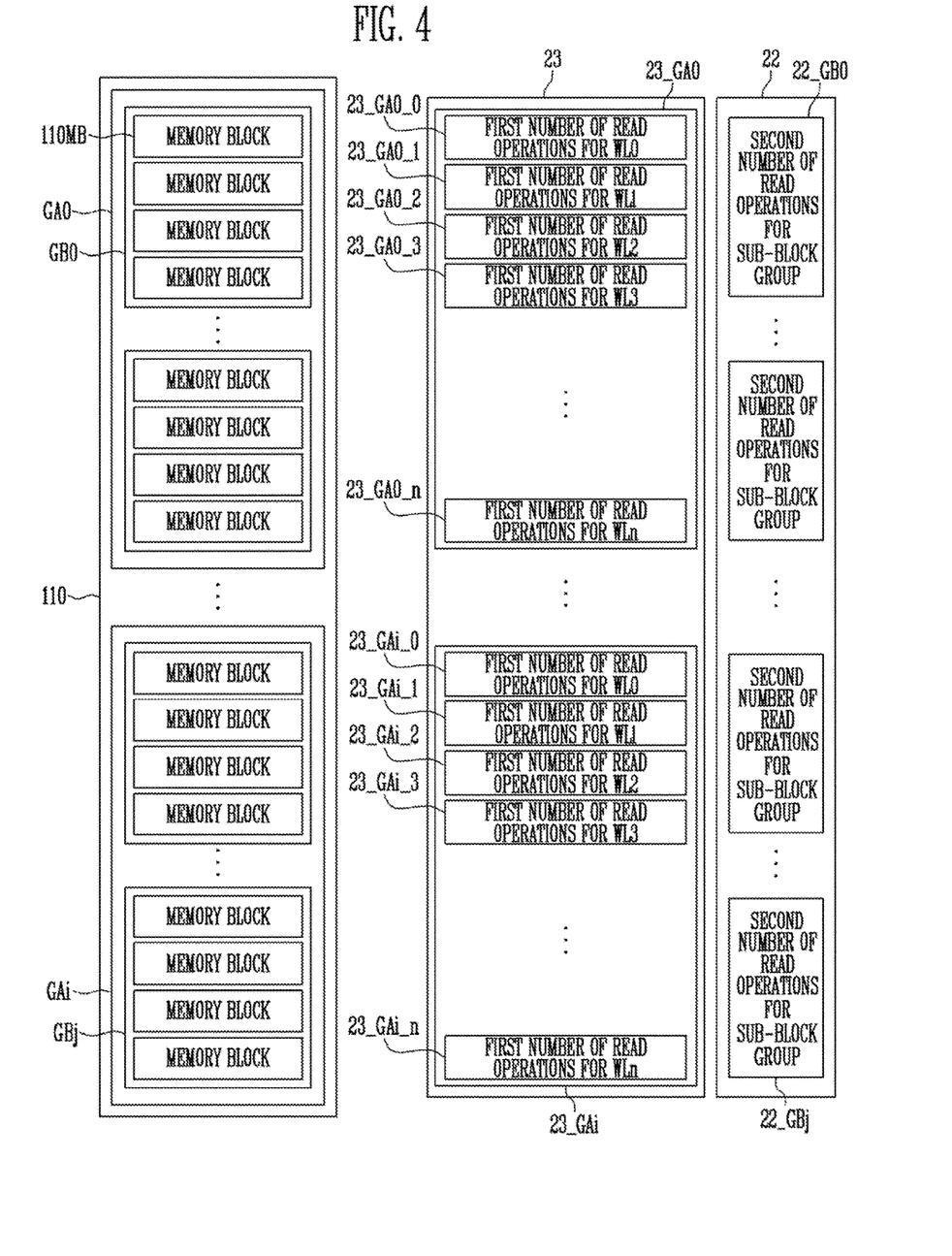
FIG. 4 is a detailed diagram of a memory array and storage parts shown in FIG. 1.

FIG. 4 is a detailed diagram of the memory array 110 and the first and second storage parts 23 and 22 shown in FIG. 1.

Referring to FIG. 4, the memory blocks 110MBs of the memory array 110 may be grouped into a plurality of sub-block groups GB0 to GBj, and the sub-block groups GB0 to GBj may be grouped into a plurality of main block groups GA0 to GAi.

Each of the sub-block groups, for example, GB0, may include, for example, 4 memory blocks 110MBs. Each of the main block groups, for example, GA0, may include, for example, 30 to 50 sub-block groups. The memory array 110 may include, for example, 10 to 30 main block groups.

The read counter 21 may count the number of times (i.e., a first number of read operations) that read operations have been performed for each word line in each of the main block groups GA0 to GAi. For example, when a read operation on memory cells which are connected to a first word line WL0 is performed in one of the memory blocks 110MBs included in the main block group GA0, the first number of read operations for the first word line WL0 increases. That is, when the read operation on the first word line in a first memory block in the main block group GA0 is performed, the first number of read operations for the first word line WL0 increases. Also, when the read operation on the first word line in the last memory block in the main block group GA0 is performed, the first number of read operations for the first word line increases.

The first storage part 23 may store the first number of read operations for each word line. The first storage part 23 may include a plurality of storage units 23_GA0 to 23_GAi. The number of storage units 23_GA0 to 23_GAi corresponds to the number of main block groups GA0 to GAi. Each of the storage units 23_GA0 may store the first number of read operations for the first word line WL0 through the first number of read operations for the last word line WLn in the corresponding main block group GA0.

Also, the read counter 21 may count the number of times (i.e., a second number of read operations) that read operations have been performed for each of the sub-block groups GB0 to GBj. For example, when a read operation on memory cells which are included in the memory block 110MB of the first sub-block group GB0 is performed, the second number of read operations for the first sub-block group GB0 increases. That is, when the read operation on the first memory block in the first sub-block group GB0 is performed, the second number of read operations for the first sub-block group GB0 increases, and when the read operation on the last memory block in the first sub-block group GB0 is performed, the second number of read operations for the first sub-block group GB0 also increases.

The second storage part 22 may store the second number of read operations. The second storage part 22 may include a plurality of storage units 22_GB0 to 22_GBj. The number of storage units 22_GB0 to 22_GBj corresponds to the number of sub-block groups GB0 to GBj. Each of the storage units 23_GB0 may store the second number of read operations for the corresponding sub-block group GB0.

The read counter 21 and the storage parts 22 and 23 may be included in the control circuit 120, and the control circuit 120 may be independently separated from the semiconductor device.

Hereinafter, a method of operating the semiconductor device described above will be explained.

Figure 5:
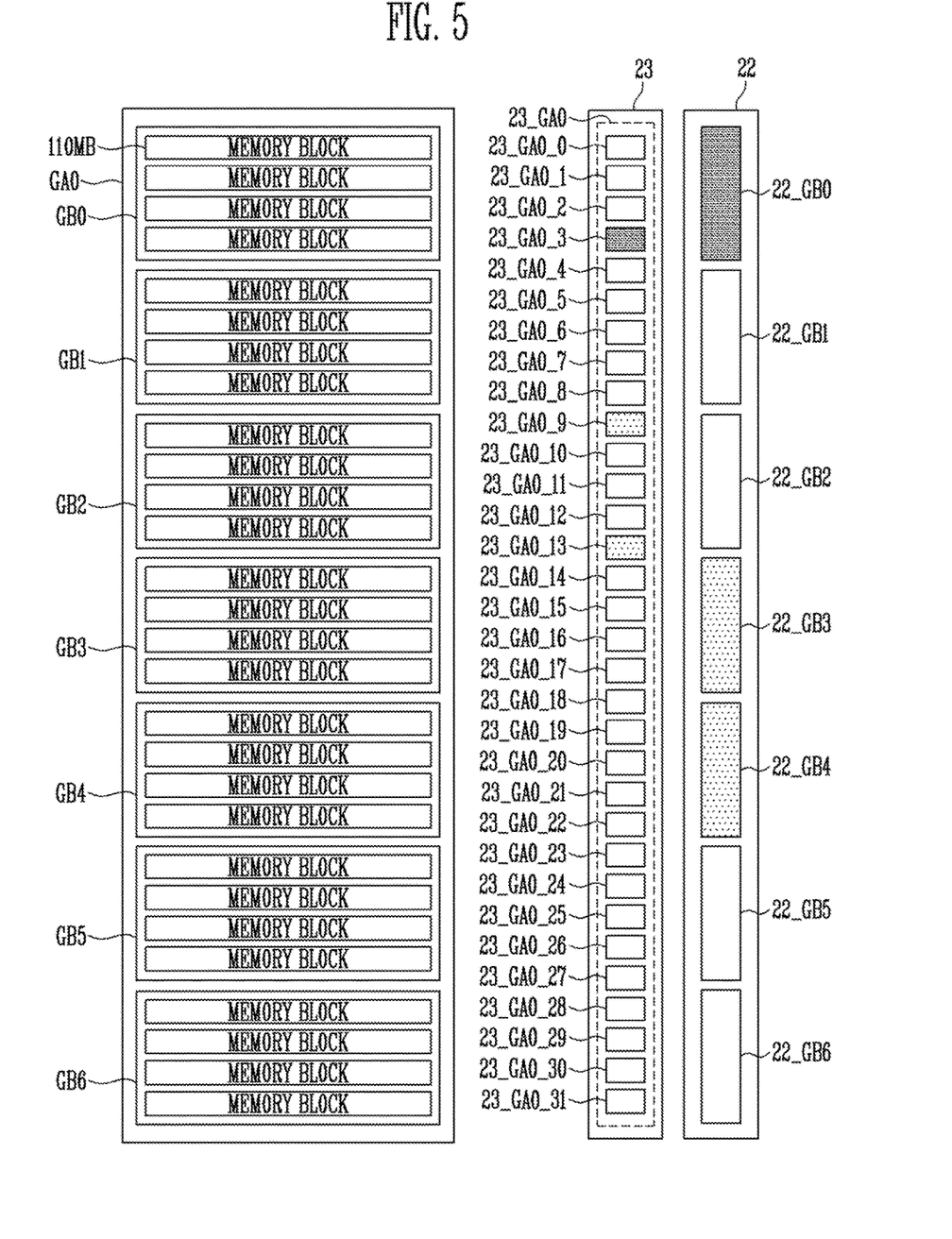
FIG. 5 is a block diagram for describing an operation of the semiconductor device according to an embodiment of the present invention.
Figure 6:
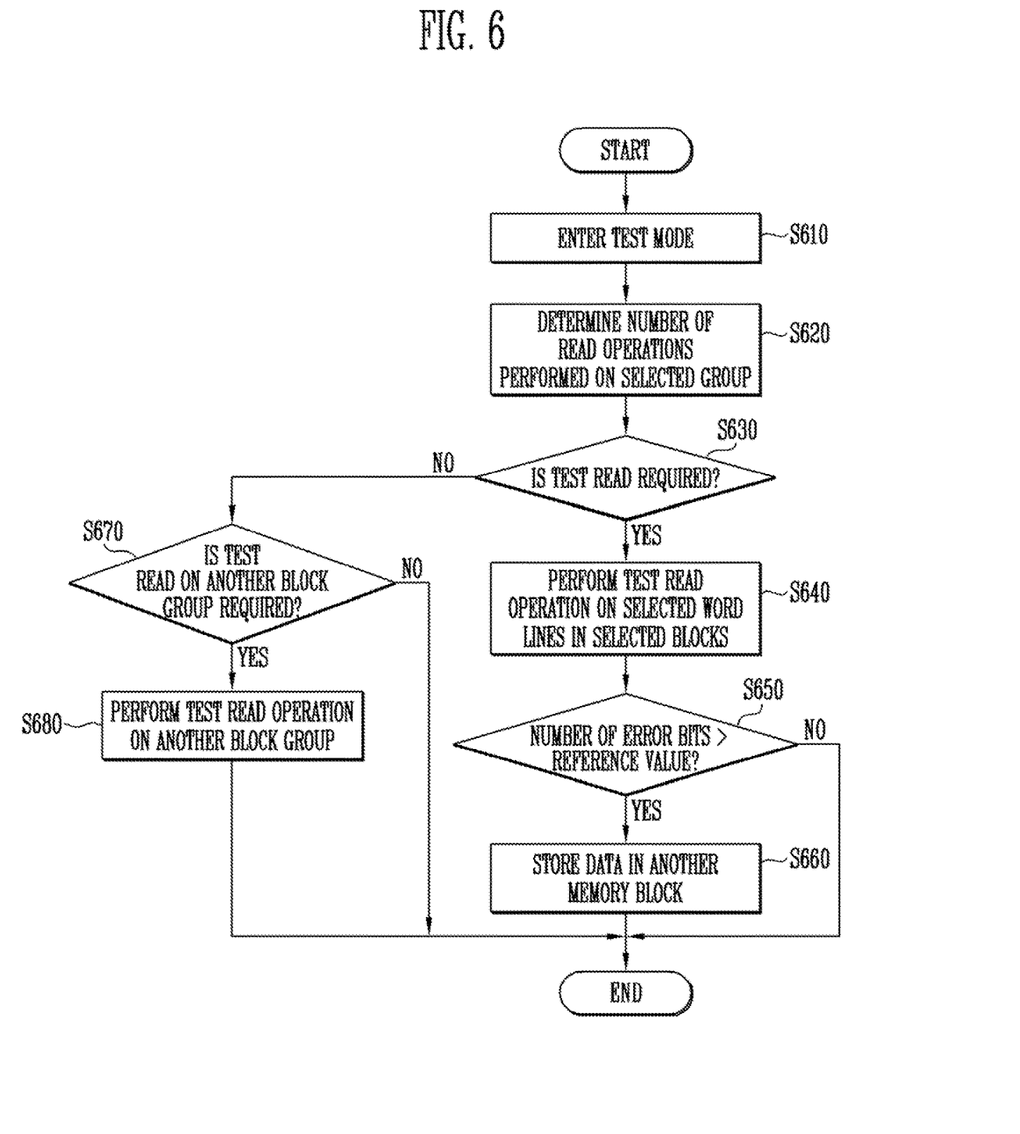
FIGS. 6 and 7 are flow charts for describing an operation of the semiconductor device according to an embodiment of the present invention.
Figure 7:
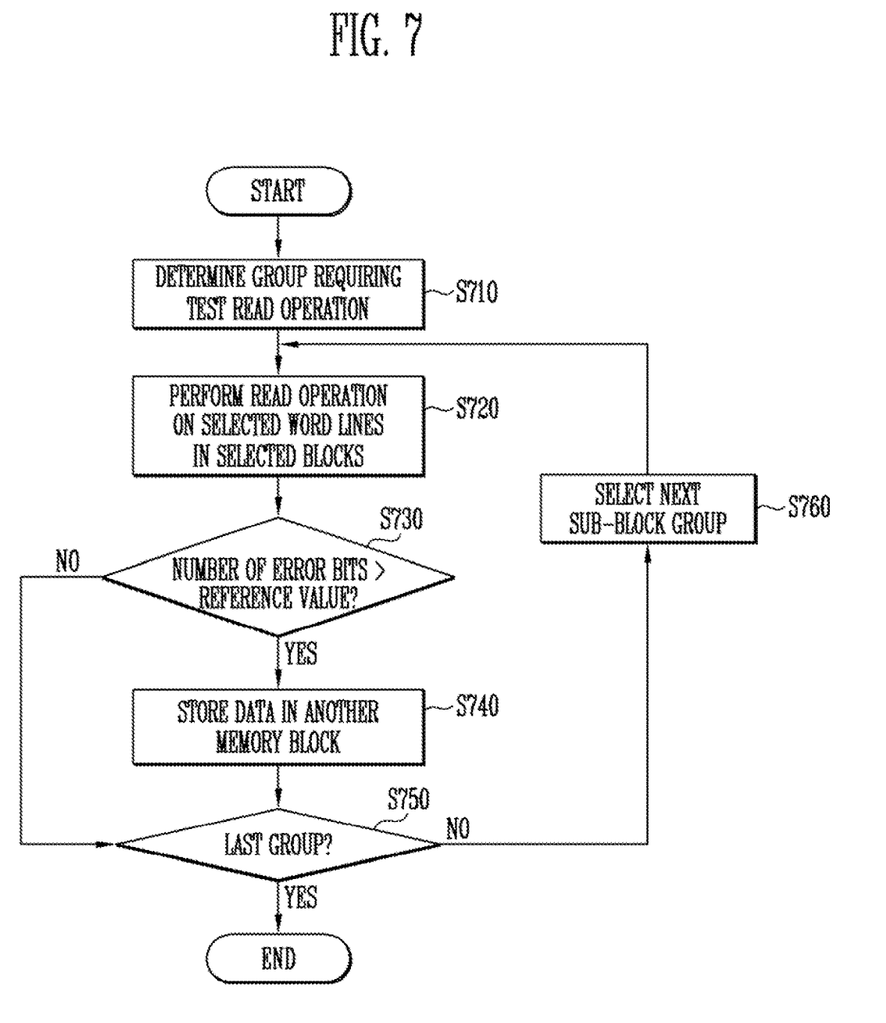

FIG. 5 is a block diagram for describing an operation of the semiconductor device according to an embodiment of the present invention. FIGS. 6 and 7 are flow charts for describing an operation of the semiconductor device according to an embodiment of the present invention.

Referring to FIGS. 1, 5 and 6, the operation circuits 120 to 140 may enter a test mode in step S610. The operation circuits 120 to 140 may enter the test mode to perform a test read operation, and enter the test mode after a read operation has been finished.

In step S620, the operation circuits 120 to 140 determine the number of times that read operations have been performed on the selected sub-block group (i.e., the number of read operations). For example, the operation circuits 120 to 140 may compare the numbers of read operations corresponding to the sub-block group, for example, GB0, which includes a memory block in which a read operation has been performed before entering the test mode, to a main reference number. More specifically, the operation circuits 120 to 140 may compare the first numbers of read operations corresponding to the main block group GA0 stored in the storage unit 23_GA0 to the main reference number, and compare the second number of read operations corresponding to the sub-block group GB0 stored in the storage unit 22_GB0 to the main reference number. The main reference number to which the first numbers of read operations 23_GA0_0 to 23_GA0_n are compared may be the same as, or different from, the main reference number to which the second number of read operations is compared.

In step S630, the operation circuits 120 to 140 determine whether to perform a test read operation. When the operation circuits 120 to 140 determine that at least one of the first numbers of read operations is greater than the main reference number and that the second number of read operations is greater than the main reference number, the operation circuits 120 to 140 perform the test read operation on the corresponding sub-block group, for example, GB0, in step S640.

In step S640, the operation circuits 120 to 140 may perform the test read operation on word lines, for example, WL2 and WL4 which are adjacent to a word line, for example, WL3, of which the first number of read operations 23_GA0_3 is more than the main reference number in the memory blocks 110MBs included in the sub-block group GB0. Specifically, the operation circuits 120 to 140 sequentially perform the read operation from the adjacent word lines WL2 and WL4 of the first memory block to the adjacent word lines WL2 and WL4 of the last memory block.

Figure 8:
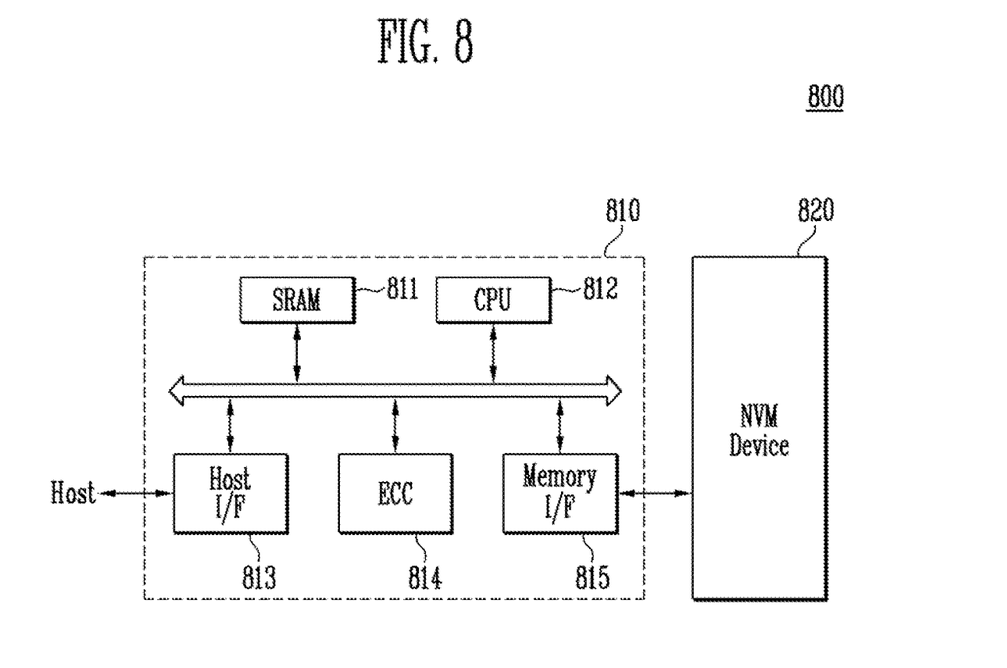
FIG. 8 is a block diagram illustrating a memory system according to an embodiment of the present invention.

In step S650, the operation circuits 120 to 140 determine whether the number of error bits included in data, which are respectively output from the word lines WL2 and WL4 of the memory blocks 110MBs which are included in the sub-block group GB0, is greater than a reference value. The comparison of the number of error bits to the reference value may be performed in the operation circuits 120 to 140, or in an error correcting circuit 814 of an external controller as illustrated in FIG. 8. The reference value may be less than the maximum number of error bits which the error correcting circuit 814 may correct, and be set to 70% to 80% of the maximum number.

In step S650, when data, which include error bits less than the maximum number of error bits that the error correcting circuit 814 may correct and greater than the reference value, is detected, data in the corresponding memory block may be transferred to another memory block in step S660. The error correcting circuit 814 may correct the error bits in the data, and the operation circuits 120 to 140 may store the corrected data in another memory block.

In step S650, when data, which include error bits less than the maximum number of error bits that the error correcting circuit 814 may correct and greater than the reference value, is not detected, the test read operation is completed without performing step S660. And, the test mode is completed. Before the test mode is completed, the operation circuits 120 to 140 may reset the first number of the read operations and second number of read operations corresponding to the sub-block group GB0.

In step S630, when the first number of read operations and the second number of read operations corresponding to the sub-block group GB0 are both less than the main reference number, the above-mentioned steps S640 to S660 may not be performed. Instead, in step S670, the operation circuits 120 to 140 may determine whether a test read operation on another block group is required. When the test read operation on another block group is required, the test read operation on the block group may be performed in step S680. This embodiment will be explained in detail as follows.

Referring to FIGS. 1, 4 and 7, in step S710, the operation circuits 120 to 140 may determine whether the test read operation on another block group is required. For example, the operation circuits 120 to 140 may determine whether there is a sub-block group of which at least one of the first number of read operations or the second number of read operations is greater than the main reference number.

More specifically, the operation circuits 120 to 140 determine whether there are sub-block groups, for example, GB3 and GB4, of which the second number of read operations is greater than a sub-reference number and the first number of read operations is greater than the main reference number although the second number of read operations is equal to or less than the main reference number. The sub-reference number may be 60% to 90% of the main reference number.

In step S720, the operation circuits 120 to 140 may perform the test read operation on memory blocks included in the checked sub-block group, for example, GB3. Specifically, the operation circuits 120 to 140 may perform the test read operation on word lines WL2 and WL4 of the first memory block through word lines WL2 and of the last memory block included in the sub-block group GB3. The test read operation may be performed in the same way as illustrated in step S640 of FIG. 6.

In step S730, the operation circuits 120 to 140 determine whether the number of error bits included in data, which are respectively output from the word lines WL2 and WL4 of the memory blocks 110MBs which are included in the sub-block group GB0, is greater than a reference value. These operations may be performed in the same way as illustrated in step S650 of FIG. 6.

In step S730, when data, which include error bits less than the maximum number of error bits that the error correcting circuit 814 may correct and greater than the reference value, is detected, data in the corresponding memory block may be transferred to another memory block in step S740. The error correcting circuit 814 may correct the error bits in the data, and the operation circuits 120 to 140 may store the corrected data in another memory block. In step S730, when data, which include error bits less than the maximum number of error bits that the error correcting circuit 814 may correct and greater than the reference value, is not detected, step S740 may be omitted.

In step S750, the operation circuits 120 to 140 determine whether test read operations of all sub-block groups have been completed. When there remains a sub-block group, for example, GB4, on which the test read operation is to be performed the next sub-block group GB4 is selected in step S760. Then, the above-mentioned steps S720 to S750 are performed again. The operation circuits 120 to 140 may reset the first number of read operations and the second number of read operations corresponding to the sub-block group in which the test read operation has been performed.

In another embodiment, in step S710, the operation circuits 120 to 140 determine whether there is a sub-block group, for example, GB0 of which at least one of the first numbers of read operations is equal to or less than the main reference number and greater than the sub-reference number, and the second number of read operations is greater than the main reference number.

In step S720, the operation circuits 120 to 140 may perform the test read operation on the checked sub-block group GB0. However, unlike the test read operation performed in step S640 of FIG. 6, the operation circuits 120 to 140 may sequentially perform test read operations of word lines WL8, WL10, WL12 and WL14 which are adjacent to word lines WL9 and WL13 of which the first number of read operations is equal to or less than the main reference number and greater than the sub-reference number.

In step S720, the operation circuits 120 to 140 may perform the test read operation on memory blocks included in the checked sub-block group GB0. Specifically, the operation circuits 120 to 140 may perform the test read operation on word lines WL8, MA0, WL12 and WL14 of the first memory block through word lines WL8, WL10, WL12 and WL14 of the last memory block included in the sub-block group GB0. The test read operation may be performed in the same way as illustrated in step S640 of FIG. 6.

In step S730, the operation circuits 120 to 140 determine whether the number of error bits included in data, which are respectively output from the word lines WL8, WL10, WL12 and WL14 of the memory blocks 110MBs which are included in the sub-block group GB0 is greater than a reference value. These operations may be performed in the same way as illustrated in step S650 of FIG. 6.

In step S730, when data, which include error bits less than the maximum number of error bits that the error correcting circuit 814 may correct and greater than the reference value, is detected, data in the corresponding memory block may be transferred to another memory block in step S740.

In step S750, the operation circuits 120 to 140 determine whether test read operations of all sub-block groups have been completed. When the operation circuits 120 to 140 determine that the test read operations of all sub-block groups have been completed, the test read operation is completed. Further, the test mode is completed. Before the test mode is completed, the operation circuits 120 to 140 may reset the first number of read operations and the second number of read operations corresponding to the sub-block group in which the test read operation has been performed.

When the semiconductor device performs the test read operation and the transfer of data as mentioned above, data preservation characteristics may be improved.

FIG. 8 is a block diagram illustrating a memory system 800 according to an embodiment of the present invention.

Referring to FIG. 8, the memory system 800 may include a nonvolatile memory (NVM) device 820 and a memory controller 810.

The NVM device 820 may correspond to the semiconductor device shown in FIGS. 1 to 7. The memory controller 810 may control the NVM device 820. The NVM device 820 may be integrated with the memory controller 810, and be used for a memory card or a semiconductor disk device such as a solid-state disk (SSD). An SRAM 811 is used as an operational memory of a central processing unit (CPU) 812. A host interface 813 includes a data exchange protocol of a host connected to the memory system 800. An error correcting block (ECC) 814 detects and corrects an error in the data read from a cell area of the NVM device 820. A memory interface 815 interfaces with the NVM device 820 of the present invention. The CPU 812 performs overall control operations for data exchange of the memory controller 810.

Although not shown in FIG. 8, a person skilled in the art will understand that the memory system 800 according to the embodiment of the present invention may further include a ROM (not shown) configured to store code data for interfacing with the host, and/or the like. The NVM device 820 may be provided as a multi-chip package having a plurality of flash memory chips. The memory system 800 according to the embodiment of the present invention may be provided to a highly reliable storage medium having improved operation characteristics. In particular, the flash memory device according to the embodiment of the present invention may form a memory system such as a semiconductor disk device (an SSD) which has been actively studied recently. In this case, the memory controller 810 may communicate with the outside, for example, the host, through at least one of various interface protocols such as a USB, an MMC, a PCI-E, an SATA, a PATH, an SCSI, an ESDI, an IDE, etc.

Figure 9:
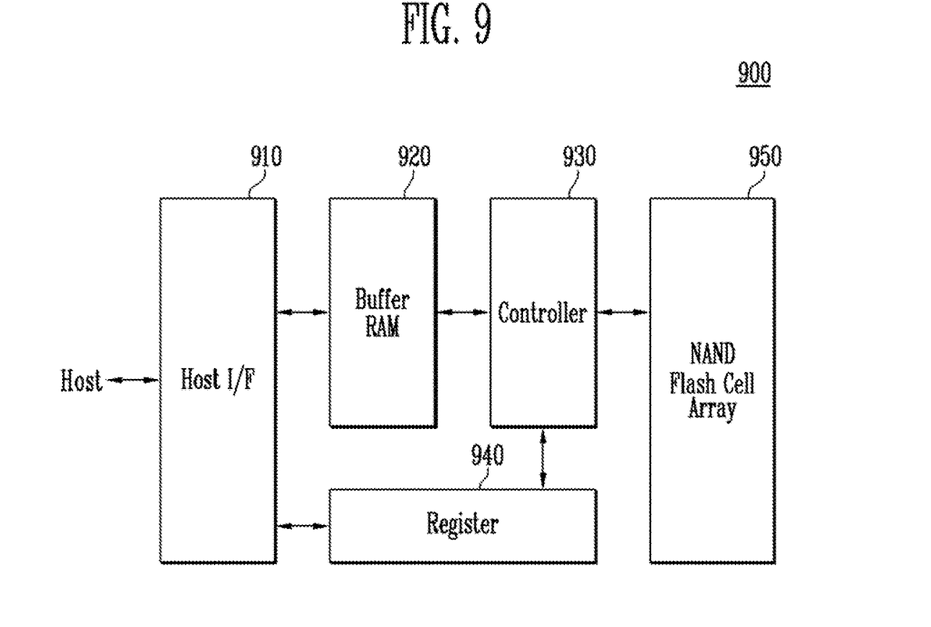
FIG. 9 is a block diagram illustrating a OneNAND flash memory device according to an embodiment of the present invention.

FIG. 9 is a block diagram illustrating a OneNAND flash memory device 900 according to an embodiment of the present invention.

The OneNAND flash memory device 900 may include a host interface 910, a buffer RAM 920, a controller 930, a register 940 and a NAND flash cell array 950. The host interface 910 exchanges overall information with devices using different protocols. The buffer RAM 920 includes a code that may drive the memory device or temporarily store data. The controller 930 controls a read operation, a program operation, and all states in response to a control signal and a command provided from the outside. The register 940 stores data such as the command, and an address, a configuration for defining a system operation environment inside the memory device, and/or the like. The NAND flash cell array 950 includes an operation circuit that has a nonvolatile memory cell and a page buffer. The OneNAND flash memory device 900 programs data in a general method in response to a write request from the host.

Figure 10:
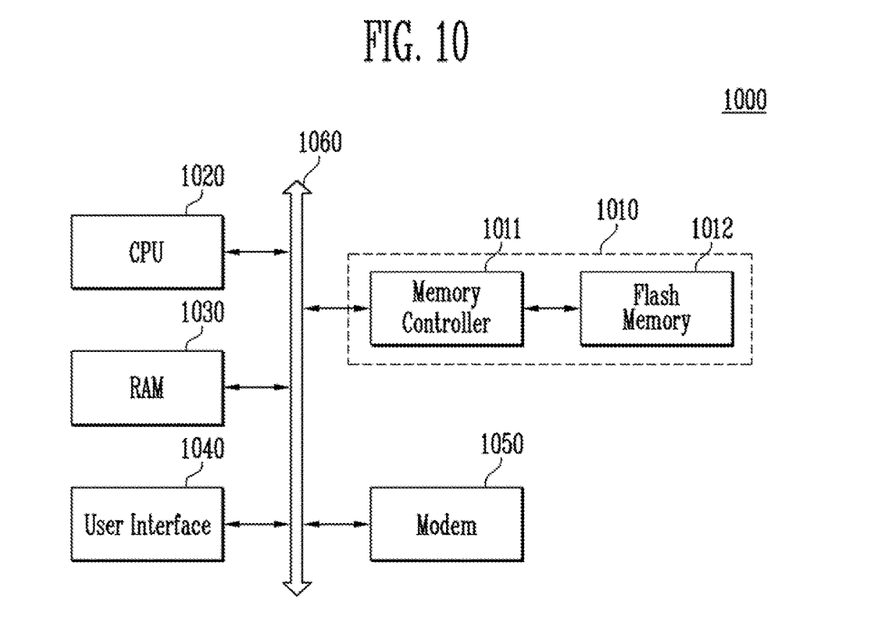
FIG. 10 is a block diagram illustrating a computing system according to an embodiment of the present invention.

FIG. 10 is a block diagram illustrating a computing system 1000 according to an embodiment of the present invention.

The computing system 1000 may include a CPU 1020, a RAM 1030, a user interface 1040, a modem 1050 such as a baseband chipset, and a memory system 1010, which are electrically connected to a system bus 1060. When the computing system 1000 is a mobile device, a battery (not shown) configured to supply an operating voltage to the computing system 1000 may be additionally provided. Although not shown in FIG. 10, a person skilled in the art will understand that, in the computing system 1000 according to the embodiment of the present invention, an application chipset, a camera image processor (CIS), a mobile DRAM, and/or the like may be further provided. The memory system 1010 for example, may be included in a solid-state drive (SSD) using the nonvolatile memory device described in FIGS. 1 to 7 to store data, or the memory system 1010 may be provided to a fusion flash memory, for example, a OneNAND flash memory.

According to the embodiments of the present invention, data preservation characteristics of a semiconductor device may be improved.

The present invention is explained with reference to the above exemplary embodiments, it will be apparent to those skilled in the art that various modifications can be made to the above-described exemplary embodiments of the present invention without departing from the spirit or scope of the invention. The scope of the present invention is presented in the appended claims, and it is intended that the present invention cover all modifications provided they come within the scope of the claims and their equivalents.

What is claimed is:

1. A semiconductor device comprising:
    a memory array including a plurality of memory blocks, wherein the memory blocks are grouped into sub-block groups and the sub-block groups are grouped into main block groups;
    a read counter to count a first number of read operations per word line for the respective main block groups and a second number of read operations for the respective sub-block groups; and
    an operation circuit to perform a test read operation according to the first number of read operations and the second number of read operations on memory cells in the memory array,
    wherein the operation circuit performs the test read operation on word lines adjacent to a word line for which the first number of read operations is greater than a main reference number in memory blocks included in a sub-block group,
    wherein the test read operation determines whether to transfer data of a memory block to which the word lines are connected to another memory block by reading the word lines adjacent to the word line for which the first number of read operations is greater than the main reference number in the memory blocks, and
    wherein if the test read operation fails, the operation circuit transfers the data of the memory block to which the word lines are connected to the another memory block.

2. The semiconductor device of claim 1, wherein the operation circuit performs a read operation on a selected memory block and the test read operation on a sub-block group.

3. The semiconductor device of claim 1, wherein the operation circuit compares the first numbers of read operations corresponding to a selected main block group, which includes a selected memory block, to the main reference number, and compares the second number of read operations corresponding to a selected sub-block group, which includes the selected memory block, to the main reference number.

4. The semiconductor device of claim 3, wherein the operation circuit performs the test read operation on the selected sub-block group when at least one of the first numbers of read operations is greater than the main reference number, and the second number of read operations is greater than the main reference number.

5. The semiconductor device of claim 1, wherein, when data read from memory cells of the adjacent word lines includes error bits equal to a reference value or more, the operation circuit stores the data in another memory block.

6. The semiconductor device of claim 5, wherein the data is stored in the another memory block after the error bits are corrected by an error correcting circuit.

7. The semiconductor device of claim 1, wherein the operation circuit performs the test read operation on the sub-block group for which at least one of the first numbers of read operations is greater than the main reference number and the second number of read operations is equal to or less than the main reference number and greater than a sub-reference number.

8. The semiconductor device of claim 7, wherein the operation circuit performs the test read operation on the word lines adjacent to the word line for which the first number of read operations is greater than the main reference number in the memory blocks included in the sub-block group.

9. The semiconductor device of claim 8, wherein, when data read from memory cells of the adjacent word lines include error bits equal to a reference value or more, the operation circuit stores the data in another memory block.

10. The semiconductor device of claim 9, wherein the data is stored in the another memory block after the error bits are corrected by an error correcting circuit.

11. The semiconductor device of claim 1, wherein the operation circuit performs the test read operation on the sub-block group for which at least one of the first numbers of read operations is equal to or less than the main reference number and greater than a sub-reference number, and the second number of read operations is greater than the main reference number.

12. The semiconductor device of claim 11, wherein the operation circuit performs the test read operation on the word lines adjacent to the word line for which the first number of read operations is greater than the sub-reference number in the memory blocks included in the sub-block group.

13. The semiconductor device of claim 12, wherein, when data read from memory cells of the adjacent word lines include error bits equal to a reference value or more, the operation circuit stores the data in another memory block.

14. The semiconductor device of claim 13, wherein the data is stored in the another memory block after the error bits are corrected by an error correcting circuit.

15. The semiconductor device of claim 1, wherein the read counter includes a first storage part configured to store the first number of read operations and a second storage part configured to store the second number of read operations.

16. The semiconductor device of claim 1, wherein, after the test read operation is performed, the first number of read operations and the second number of read operations are reset.

17. A semiconductor device comprising:
 a memory array including a plurality of memory blocks, wherein the memory blocks are grouped into sub-block groups, and the sub-block groups are grouped into main block groups; and
 an operation circuit configured to count a first number of read operations per word line for the respective main block groups and a second number of read operations for the respective sub-block groups, and perform a test read operation on a sub-block group for which the first number of read operations or the second number of read operations is greater than a main reference number,
 wherein the operation circuit performs the test read operation on word lines adjacent to a word line for which the first number of read operations is greater than the main reference number in memory blocks included in the sub-block group,
 wherein the test read operation determines whether to transfer data of a memory block to which the word lines are connected to another memory block by reading the word lines adjacent to the word line for which the first number of read operations is greater than the main reference number in the memory blocks, and
 wherein if the test read operation fails, the operation circuit transfers the data of the memory block to which the word lines are connected to the another memory block.

18. The semiconductor device of claim 17, wherein, when data read from memory cells of the adjacent word lines include error bits equal to a reference value or more, the operation circuit stores the data in another memory block after the error bits are corrected by an error correcting circuit.

* * * * *